United States Patent [19]

Kitano et al.

[11] Patent Number: 5,279,809
[45] Date of Patent: Jan. 18, 1994

[54] ZINC OXIDE CRYSTAL AND METHOD OF PRODUCING SAME

[75] Inventors: Motoi Kitano, Kawanishi; Sachiko Maeda, Izumi; Takeshi Hamabe, Kawanishi; Takashige Sato, Takatsuki; Mitsumasa Oku, Osaka, all of Japan

[73] Assignee: Matsushita Electric Industrial Co., Ltd., Osaka, Japan

[21] Appl. No.: 974,434

[22] Filed: Nov. 12, 1992

[30] Foreign Application Priority Data

Nov. 14, 1991 [JP] Japan .................................. 3-327134

[51] Int. Cl.$^5$ .............................................. C01G 9/02
[52] U.S. Cl. ..................................................... 423/622
[58] Field of Search ......................................... 423/622

[56] References Cited

U.S. PATENT DOCUMENTS 5,066,475 11/1991 Yoshinaka et al. .................. 423/622

FOREIGN PATENT DOCUMENTS 0407601 1/1991 European Pat. Off. .

OTHER PUBLICATIONS

Motoi Kitano, et al. "Growth of Large Tetrapod-like ZnO Crystals II. Morphological Considerations on Growth Mechanism", Journal of Crystal Growth, vol. 108, No. 1/2, Jan. 11, 1991, Amsterdam NL, pp. 277-284.

*Primary Examiner*—Wayne Langel
*Attorney, Agent, or Firm*—Stevens, Davis, Miller & Mosher

[57] ABSTRACT

A novel zinc oxide crystal has an octahedral nucleus whose faces are alternately zinc faces and oxide faces, and this crystal has such a geometric shape that a needle is grown on each of the faces. The needle grown on the oxide face is branched into three sections which are disposed in parallel relation, and the needle on the oxide face is shorter than the needle on the zinc face. This novel crystal having oxide films can be produced in a homogeneous manner by mixing zinc-tin alloy powder or tin powder with zinc powder, having an oxide film formed on each particle thereof, to form a powder mixture and then by heating the powder mixture at 820° C. to 1100° C. in an oxidizing atmosphere to oxide the same. The tin concentration in the power mixture is less than 40 wt. %.

12 Claims, 1 Drawing Sheet

10μm

10μm

10μm

ZINC OXIDE CRYSTAL AND METHOD OF PRODUCING SAME

BACKGROUND OF THE INVENTION

This invention relates to a zinc oxide crystal of a novel shape and a method of producing the same. Products of the present invention can be used as an industrial material and a material for the purpose of the people's livelihood.

Zinc oxide crystals obtained by gas-phase methods have various geometric shapes such as a granular shape, a needle-shape, a sheet-shape and a tetrapod-shape. Particularly, when tetrapod-like crystals are produced by such a method or under such a condition that a satisfactory controllability is not obtained, crystals other than such tetrapod-like crystals are also present in a mixed manner, and in some cases, the number of the needles is larger than the number of the tetrapod-like crystal, and these are connected together at a same junction to form the crystal. Therefore, in a group of such crystals of a complicated shape, the number of the needles is quite irregular, and hence no homogeneity is found, and the angle between the needles is not constant. Furthermore, sheet-like crystals influence the mechanism of the formation and growth of the crystal, and the crystals often are formed with such sheet-like crystals connected thereto.

As described above, there are often produced the by-product crystals in which the needles (hereinafter referred to as "legs") are interconnected at one point, and four or more legs grow randomly. There is no reproducibility in connection with the shape of such similar crystals, and they are the mixture of such a complicated shape that it is difficult to find such similar crystals of the same shape even in the same batch.

There has heretofore been proposed a mechanism of increase of the number of legs from a tetrapod-like crystal, in which new legs further grow in a twinning manner from an edge of a thin-sheet crystal formed and grown in a twinning manner between the legs of the tetrapod-like crystal. Only with such a twinning mechanism, it is difficult to control the spots of formation of such legs and the frequency of this formation, and even if the number of legs of the produced crystal, the angle between the legs of this crystal, the number of the sheet-like crystals, and the growth degree are taken into consideration, it is extremely difficult to obtain the crystal of a uniform shape.

The inventor of the present invention have made extensive study and analysis of the above crystals, having no constant shape, in various ways such as an X-ray diffraction method, an electron diffraction method and an etching treatment. As a result, it has been found that there are many factors in the growth mechanism, and that defects such as various dislocations due to the complication of these factors often develop, and it has been confirmed that no constant shape of the above crystal is due to such defects.

In several gas-phase methods of producing a zinc oxide crystal (particularly, a tetrapod-like zinc oxide crystal), the above zinc oxide crystal of a complicated shape is presented in mixed relation to a tetrapod-like crystal when metallic zinc is burned and oxidized in an atmosphere of a relatively high oxygen concentration.

Therefore, in order to obtain the totally-novel zinc oxide crystal of the present invention having a constant structure, it is necessary to establish and use a new growth method achieving a growth mechanism different from those of the conventional methods.

On the other hand, there has not yet been publicly announced or manufactured a homogeneous crystal having legs the number of which is not less than the number (four) of the legs of the tetrapod-like crystal.

SUMMARY OF THE INVENTION

With the above problems of the prior art in view, it is an object of this invention to provide a zinc oxide crystal having a novel shape and a novel structure.

Another object of the invention is to provide a method of producing such a novel zinc oxide crystal.

In order to achieve the above objects, according to the present invention, zinc-tin alloy powder or tin powder is mixed with zinc powder having an oxide film (oxide layer) formed on each of its particles, and this mixture is heated and oxidized to grow the zinc oxide crystal of the present invention. More specifically, the tin concentration in the above powder mixture (starting material) is less than 40 wt. % (preferably less than 30 wt. %), and the temperature within a reaction furnace is maintained at 820° C. to 1100° C. (preferably, 860° C. to 1000° C.), and in this condition, after the powder mixture is charged, the air or oxygen is introduced into the furnace to effect the oxidation. The oxide film formed on the surface of each of the particles of the zinc powder (starting material) can be produced by a method in which the zinc material is mechanically ground into powder which is subsequently dipped in pure water, or by a powder production method in which metallic zinc in a molten state is sprayed or atomized into the air. Then, this zinc powder is mixed with the zinc-tin alloy powder or the tin powder as described above, and this mixture is introduced into a dish-like vessel, and is spread there, and this dish-like vessel is put in a crucible-like container made of a net, and then this crucible-like container is introduced into the furnace set under a predetermined condition, thereby effecting the reaction. The proper amount of flow of the air or oxygen, as well as the reaction time, varies much depending on the volume in the furnace, the amount of the powder mixture (starting material), the set temperature and so on. The amount of flow of the oxygen generally corresponds to the amount of air flow.

Features of the crystal, obtained by the crystal growth procedure and the production method of the present invention having the above various factors and conditions, are that the crystal has an octahedral nucleus whose faces are alternately zinc faces and oxide faces, and that the crystal has such a geometric shape that leg-like needles grow from each of these faces. More specifically, the number of the needle or leg growing from each zinc face is one whereas the number of the needles or legs growing on each oxide face is three which are provided in a branched manner i.e. top surface of one short leg is made up three segments with grain boundaries. However, these three legs develop from the common oxide face, and therefore grow generally parallel to one another (that is, they are not so different in angle of extension), and therefore the branched condition is not clear from the appearance, so that these legs may be seen as one to three legs. Another feature is that the legs growing from the oxide face is shorter than the leg growing from the zinc face. A further feature is that each of the legs formed on the oxide and zinc faces extends perpendicularly to its corresponding face, and therefore the angle between the legs is not varied greatly, and as a result there can be obtained the homogeneous zinc oxide crystal having a shape which has not heretofore been obtained.

The operation in each step of the above means will now be described.

With the use of a system obtained by removing the tin component from the starting material composition for producing the zinc oxide crystal of the present invention, a homogeneous zinc oxide of a tetrapod-like shape having long legs (10 to 300 μm in length) is obtained under the same production condition as that of the present invention. At this time, if zeolite or the like is caused to coexist, the homogeneity is further improved. The tetrapod-like crystal thus obtained has an octahedral nucleus at its central portion whose faces are alternately zinc faces and oxide faces. Legs of the tetrapod are grown on the zinc faces, and no leg is grown on the oxide faces. This has been confirmed from results of etching in which the particle of the crystal in which the octahedral nucleus particle and the legs are in the process of growth, as well as the particle of the crystal in which the legs have completely grown up, are etched by nitric acid.

However, when the starting material composition of the present invention including the tin component is used to meet the requirements of the present invention, the zinc oxide crystal of the above novel geometric shape is produced. The features of this crystal are that three legs grow on each of the oxide faces, and that the crystal exhibits the grain boundaries in which the leg, having generally the same shape and size as that on the tetrapod crystal obtained from the above-mentioned system free of the tin, is grown on the zinc face.

By analysis (e.g. an electron diffraction method or an X-ray micro analyzer method), trace amount of $Zn_4SnO_4$ and tin can be detected from the oxygen facets of the short legs, but the $Zn_4SnO_4$ and tin can not be detected from the remainder of the crystal.

From this, it is thought that there is the effect of a VLS (vapor-liquid-solid) mechanism in which a liquid alloy layer greatly contributes to a crystal growth, though this assumption is not limitative.

Under the conditions of the present invention, the tin vapor from the powder mixture (starting material) must form a liquid solution with the zinc oxide on the crystal surface to be grown. Therefor, the liquid droplet must rise selectively from the four oxygen facets of the octahedral nucleus of the growing tetrapod-like ZnO crystals. Then, in the reaction atmosphere defined in the present invention, the zinc vapor diffuses through the oxidized layer on the surface of the zinc particle, and evaporates. The above droplet has the ability of selectively absorbing the vapor from its vapor-liquid interface, and the absorbed component moves to the facets of the developing short legs, that is, the liquid-solid interface to form new zinc oxide, and hence is incorporated into the leg growth. Then, the liquid alloy droplet is necessarily applied to the top of the leg as the leg develops and extends.

In the case where tip in the powder composition (starting material) is provided in the form of tin powder, the alloy droplets are formed by the combination of the tin and zinc oxide as shown in the above example at an initial stage of the reaction, and thereafter the crystal proceeds with a similar mechanism.

The rate of growth of the leg is accelerated by this liquid alloy layer, and the growth of the leg from the zinc face starts earlier in time, and since the zinc face is of very much higher polarity as compared with the oxide face, the rate of growth of the leg from the zinc face is high, and the leg of a final form on the zinc face is large in size. The three-branched legs developing during the leg growth on the oxygen face are produced due to the facts that each of the faces constituting the octahedral nucleus is triangular, and that each apex of this triangular face and the central portion of the triangular face are different from each other in activity of bonding to the zinc vapor (This is a so-called "Berg effect").

In the VLS mechanism, the stable formation of the liquid alloy layer of tin and zinc oxide is an important factor, and also the gas phase-reactive and controlled evaporation into the system of the zinc vapor is essential. In this evaporation control (the latter factor), the oxide films on the zinc particles (starting material) are retained stably under the conditions of the present invention, and the rate of evaporation of zinc from the inside of the film is controlled in a manner of a film diffusion mechanism. In the above alloy formation (the former factor), the proportion of existence of the tin component gives an influence. Consequently, if the tin concentration exceeds 40 wt. %, the amount of the tin becomes too large, and this alloy rise on every portion of the growing crystal, and this complicates the shape, and adversely affects the homogeneity. However, this weight percent value of the tin varies depending on the composition of the starting material powder of the present invention, the manner of existence of the tin, the amount of the tin, the temperature within the furnace, the amount of supply of the air or oxygen, and so on, and therefore these conditions must be taken into consideration collectively. Oxygen gas has a higher oxidizing ability even at a lower flow rate, as compared with the air, and the crystal with the legs whose cross-sectional area is large is obtained with the use of oxygen gas, whereas the crystal with the narrow legs is obtained with the use of the air.

The temperature within the furnace is influenced by the above various factors. If this furnace temperature is lower than 820° C., the rate of production of the above tin vapor is too low, so that the liquid alloy layer composed of zinc oxide and tin can not be easily formed. In contrast, if the above furnace temperature is higher than 1100° C., the rate of production of the tin vapor is too high, and also the alloy layer becomes unstable. Therefore, the VLS mechanism will not efficiently proceed outside the range of 820° C. to 1100° C., and the zinc oxide crystal of the novel shape according to the present invention can not be obtained.

DESCRIPTION OF THE INVENTION

Figure 1A:
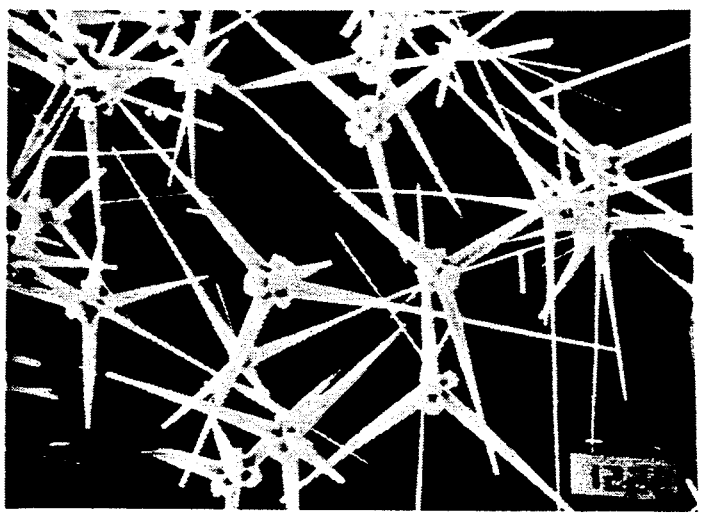
FIG. 1(a) is an electron micrograph showing a zinc oxide of the present invention having a novel geometric shape.
Figure 1B:
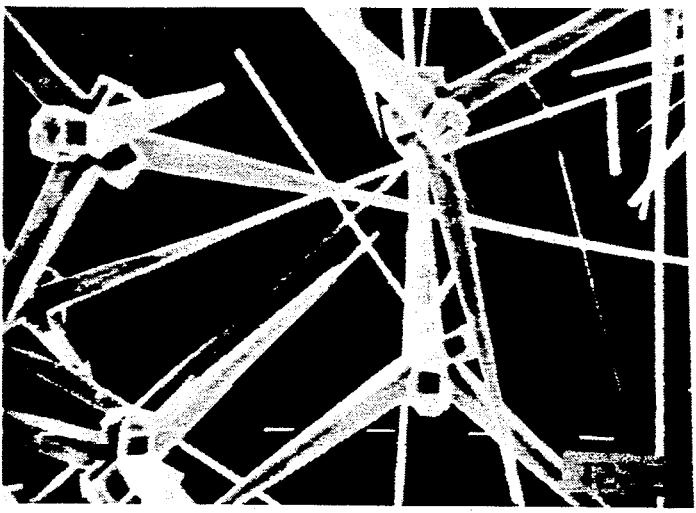
FIG. 1(b) is a portion of the electron micrograph of FIG. 1(a) on an enlarged scale.
Figure 1C:
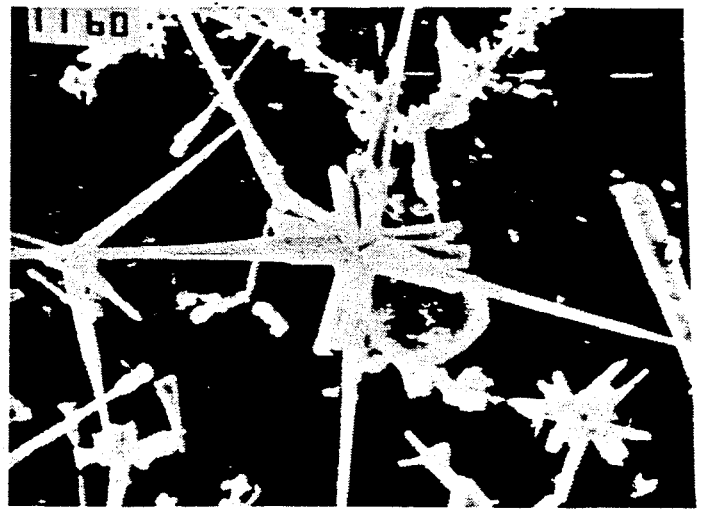
FIG. 1(c) is an electron micrograph showing a condition in which legs on oxide faces are grown further, as compared with those shown in FIG. 1(b).

A zinc oxide crystal with a novel geometric shape according to the present invention, as well as a method of producing the same, will now be described by way of the following Examples and Comparative Examples.

EXAMPLE 1

A zinc metal wire was melted and sprayed to form metal powder, and deionized water was poured to this metal powder, and then this metal powder was ground for 20 minutes in a mortar, and then was dipped for 15 hours, and then was dried. Tin-zinc alloy powder was added to the thus-formed zinc powder (having strengthened oxide films on the particles thereof) in a weight ratio of 1:1 to form a starting material composition. The tin content of this composition was 16 wt. %. 160 g of the starting material composition as put on a stainless steel dish, and was spread to form a layer of the starting material composition having a thickness of not more than 1 cm. Then, this dish was put in a square crucible-like container of a stainless steel net, and this container was introduced into a box-like furnace (having an internal volume of 28 liters) maintained at 940° C., and then the starting material composition was heated and oxidized for 30 minutes, while flowing the air at a rate of 3 liter/minute. Thereafter, the sample was taken out from the furnace, and was cooled to a room temperature.

Zinc oxides crystals of the novel shape according to the present invention were formed in a high concentration mainly in the intermediate layer portion in the crucible, and the zinc, the tin and composite crystals of a quite complicated shape were formed in the lower layer portion in the crucible, and crystals, in which although legs on zinc faces of a tetrapod were extended sufficiently long, only the trace of bush-like crystal growth was seen on an oxide face, were formed in the upper layer portion in the crucible. The total amount of the crystals of the present invention contained in the sample was 35 wt. %, and the long leg on the zinc face as 70 $\mu$m, and the shorter leg on the oxygen face as 25 $\mu$m. It has been confirmed by electron diffraction that each of the legs on the zinc face and the oxide face was a single crystal of zinc oxide. Upon analysis using the etching by a very dilute hydrochloric acid in combination with electron diffraction, a trace amount of $Zn_2SnO_4$ could be detected from the distal end of the leg on the oxygen face. Only the zinc oxide could be detected from the other portions of the crystal. The growth of the central nucleus was so well that the ridges of the octahedral nucleus could be clearly seen, and since the legs were grown in balanced relation to this nucleus, the angle between the legs was properly maintained. Further, each of the legs on almost all oxide faces wa longitudinally split into three, and these three legs were grown in parallel relation.

EXAMPLE 2

The same furnace and the same starting material composition as in Example were used. However, the tin concentration of the starting material was 25 wt. %, and the temperature within the furnace was set to 950° C. 200 g of the starting material composition was used, and oxygen gas was caused to flow at a rate of 1 liter/minute, and the starting material composition was heated and reacted for 45 minutes.

As in Example 1, the crystals of the present invention among the produced crystals existed in the crucible; however, the upper limit line (up to which the crystals of the present invention existed) was closer to the surface in this Example than in Example 1, and the total amount of the crystals of the present invention was 44 wt. %. The average length of long legs on zinc faces was 110 $\mu$m, and the average length of short legs on oxide faces was 30 $\mu$m, and the angle between the legs was as proper as in Example 1. Although each of the legs on most of the oxide faces was split into three, there were a few oxide faces on which the leg was not split, or was split into two. Each of the legs was a single crystal, and $Zn_2SnO_4$ and tin could be detected from the distal end of the leg on the oxide face.

EXAMPLE 3

The same furnace as in Example 1 was used, and a starting material composition as prepared by adding tin powder to the same zinc powder as used in Example 1. The tin content of the starting material composition was 10 wt. %. The temperature within the furnace as maintained at 910° C., and the amount of the starting material powder was 130 g. The air was caused to flow at a rate of 3.5 liter/minute, and the reaction was carried out for 40 minutes. The other conditions and operation were the same as in Example 1.

Produced crystals of the present invention existed in a concentrated manner as in Examples 1 and 2, and the total amount of these crystals were 27 wt. %. The average length of long legs was 50 $\mu$m, and the average length of short legs was 15 $\mu$m, and these legs were a single crystal. The splitting of the leg on the oxide face was analogous to that found in Example 2. The angle between the legs was also analogous.

EXAMPLE 4

A tubular furnace having a heat-resistant ceramic furnace core tube was used. An effective internal volume of the furnace was 1 liter, and the temperature within the furnace was maintained at 920° C. Zinc powder of a starting material composition powder was prepared according to the same procedure of Example 1 except for the later treatment by deionized water. However, it was confirmed that a thin oxide film was formed on each particle of the zinc powder. The same tin-containing powder as in Example 1 was used, and the amount of this powder was 50 wt. %. The tin concentration in the powder mixture was 13 wt. %. 5 g of this powder mixture was put in a boat of alumina, and this boat was disposed at a central portion of the furnace core tube, and the reaction was conducted for 30 minutes. Simultaneously when the reaction was started, the air was caused to flow at a rate of 5 liter/minute.

The portions where produced crystals of the present invention existed were hardly different from those in Example 1, and the total amount of the crystals of the invention was 21 wt. %. The average length of long legs was 50 $\mu$m, and the average length of short legs was 10 $\mu$m, and the condition of splitting of the leg was analogous to that in Example 2.

COMPARATIVE EXAMPLE

The same box-like furnace as in Example 1 was used. 150 g of a starting material mixture composition, composed of tin powder and zinc powder having no oxide film, was used. The tin concentration of this composition was 50 wt. %. The operation was performed according to the same procedure of Example 1. The temperature within the furnace was maintained at 800° C., and the amount of the air and the reaction time were the same as in Example 1.

Products were all polycrystals, and any crystal having the same shape as that of the present invention was not produced at all.

COMPARATIVE EXAMPLE 2

The same tubular furnace as in Example 4 was used. Using the same starting material as in Comparative Example 1, the operation was performed according to the same procedure of Example 4. However, the temperature within the furnace was set in the same manner as in Comparative Example 2, and the amount of the air and the reaction time were the same as in Example 4. As a result, as in Comparative Example 1, products of the present invention were not produced at all.

COMPARATIVE EXAMPLE 3

The same furnace and the same starting material as in Example 1 were used. The temperature within the furnace was set to 1120° C., and the air was caused to flow at a rate of 2 liter/minute, and the reaction was effected for 45 minutes. As a result, any crystals having the novel shape of the present invention were not found at all, and instead all the crystals that were produced were those having tin oxide components deposited on the surface, and those branched in a complicated manner and connected in an irregular manner.

As described above, the zinc oxide crystal of the present invention having the novel shape can be produced by adding less than 40 wt. % tin metal powder to the starting material powder, and by causing the crystal to grow in an oxidizing atmosphere at temperatures of 820° C. to 1100° C. Therefore, the product of the present invention can be used as an industrial single crystal material, capable of achieving the effect of the novel shape, either alone or in combination with other matrix to form a composite material, and great effects in the industry can be achieved.

What is claimed is:

1. A zinc oxide crystal having an octahedral nucleus whose faces are alternately zinc faces and oxide faces, said crystal having such a geometric shape that a needle is grown on each of said faces.

2. A zinc oxide crystal according to claim 1, in which said needle grown on each of said oxide faces is divided into three sections.

3. A zinc oxide crystal according to claim 1, in which said needle grown on said oxide faces is shorter than said needle grown on said zinc faces.

4. A zinc oxide crystal according to claim 2, in which said needle grown on said oxide faces is shorter than said needle grown on said zinc faces.

5. A method of producing a zinc oxide crystal comprising the steps of mixing zinc-tin alloy powder or tin powder with zinc powder, which zinc powder has an oxide film formed on each particle thereof, to form a powder mixture; and heating said powder mixture to oxidize the same.

6. A method according to claim 5, in which the tin concentration in said powder mixture is less than 40 wt. %.

7. A method according to claim 5, in which the temperature within a reaction furnace is maintained at 820° C. to 1100° C., and subsequently said power mixture is introduced into said furnace, and subsequently air or oxygen is caused to flow in said furnace to oxidize said powder mixture.

8. A method according to claim 6, in which the temperature within a reaction furnace is maintained at 820° to 1100° C., and subsequently said powder mixture is introduced into said furnace, and subsequently air or oxygen is caused to flow in said furnace to oxidize said powder mixture.

9. A method according to claim 4, in which the tin concentration in said powder mixture is not more than 40 wt. %, and the powder mixture is heated at a temperature in the range of 820° C. to 1100° C.

10. A method according to claim 5, wherein the content of the tin contained in the powder mixture is in the range of not less than 10 wt. % but not more than 40 wt. %.

11. A method according to claim 4, wherein the heating of the powder mixture is effected under a condition where air flow or oxygen flow is introduced at a constant rate.

12. A method of producing a zinc oxide crystal comprising the steps of:
 preparing powder of zinc particles each having zinc oxide on the surface thereof;
 mixing the zinc powder with zinc-tin alloy powder so that a powder mixture is obtained which comprises not more than 40 wt. % tin and the balance zinc; and
 heating the powder mixture at a temperature in the range of 820° C. to 1100° C.

* * * * *